(12) United States Patent
Masui

(10) Patent No.: US 7,091,597 B2
(45) Date of Patent: Aug. 15, 2006

(54) POWER SUPPLY DEVICE

(75) Inventor: Yoshitsugu Masui, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 43 days.

(21) Appl. No.: 10/896,170

(22) Filed: Jul. 22, 2004

(65) Prior Publication Data

US 2005/0024958 A1    Feb. 3, 2005

(30) Foreign Application Priority Data

Jul. 28, 2003   (JP) .............................. 2003-202301

(51) Int. Cl.
*H01L 23/48* (2006.01)
*G01R 31/26* (2006.01)

(52) U.S. Cl. ............... 257/690; 257/402; 257/E21.696; 438/14

(58) Field of Classification Search ................ 257/402, 257/690; H01L 23/48; G01R 31/26
See application file for complete search history.

(56) References Cited

U.S. PATENT DOCUMENTS 5,488,256 A * 1/1996 Tsunoda ..................... 257/723
6,150,724 A * 11/2000 Wenzel et al. ............... 257/777
6,252,305 B1 * 6/2001 Lin et al. ..................... 257/777
6,300,146 B1 * 10/2001 Thierry ........................ 438/14

FOREIGN PATENT DOCUMENTS

JP        2000-299634 A     10/2000

* cited by examiner

*Primary Examiner*—David Nelms
*Assistant Examiner*—Dao H. Nguyen
(74) *Attorney, Agent, or Firm*—Birch, Stewart, Kolasch & Birch, LLP

(57) ABSTRACT

A power supply device includes a control IC fabricated by a bipolar process and a power supply element fabricated by a MOS process, both of them die-bonded on a leadframe, and with a chip edge of one of them kept in intimate contact with a chip edge of the other. Thus, heat conducts via those chip edges with increased efficiency, permitting the heat generated in the power supply element to quickly conduct to the control IC. This prevents heat-induced breakdown to which a MOS semiconductor is susceptible. The power supply element fabricated by a MOS process can be a horizontal structure so that a current flows from one part of the top surface of the chip to another. This makes it easy to reduce power loss. The power supply element and the control IC can be die-bonded with a single type of die-bonding paste.

20 Claims, 9 Drawing Sheets

POWER SUPPLY DEVICE

This nonprovisional application claims priority under 35 U.S.C. § 119(a) on Patent Application No. 2003-202301 filed in Japan on Jul. 28, 2004, the entire contents of which are hereby incorporated by reference.

BACKGROUND OF THE INVENTION

1. Field of the Invention

The present invention relates to power supply devices that are used to stably operate TVs, VCRs, DVD players, DVD recorders, personal computers, peripheral devices therefor, various household appliances, and the like.

2. Description of Related Art

In a conventional power supply device 1, as shown in FIG. 9, an IC 15 including a PNP transistor and other components are typically integrated on a single chip, and are then molded in a resin package as a single device.

To alleviate the power loss through the power supply device 1 and simultaneously achieve stable power supply therefrom, there have recently been put on the market devices having a two-chip structure wherein, as shown in FIG. 10, a control IC 16 fabricated by a bipolar process and a power supply element 17 also fabricated by a bipolar process are provided side by side.

In a series regulator, which is one of the most common types of power supply devices, the power loss therethrough is determined by calculating the difference between the input and output voltages and then multiplying the result by the output current. Accordingly, the power loss can be reduced by reducing the difference between the input and output voltages. In this case, an effective way to achieve that is to use, as the power supply element 17, a PNP transistor having a vertical structure. The reason is that, in a PNP transistor having a vertical structure, which has a collector electrode and a base electrode formed on the top surface of a chip and has an emitter electrode formed on the bottom surface of the chip, the collector current flows from the top surface to the bottom surface of the chip.

However, even a PNP transistor having a vertical structure is not free from an emitter-collector saturation voltage inherent in the physical properties thereof, and thus it is impossible to reduce the difference between the input and output voltages to smaller than the emitter-collector saturation voltage. Specifically, the limit that cannot be surmounted is generally believed to be about 0.3 V, although it somewhat varies with the magnitude of the output current and from one PNP transistor to another.

Thus, one way to further reduce power loss is believed to be to use a power supply element fabricated by a MOS process. When a power supply element fabricated by a MOS process is combined with a control IC fabricated by a bipolar process, the low on-state resistance of a MOS semiconductor can be exploited to realize lower power loss than when, as conventionally practiced, a PNP transistor fabricated by a bipolar process is used.

However, incorporating such two chips, namely a control IC fabricated by a bipolar process and a power supply element fabricated by a MOS process, into a single package poses the following challenges: how to prevent heat-induced breakdown of the MOS semiconductor and how to prevent electrostatic breakdown of the bipolar semiconductor.

SUMMARY OF THE INVENTION

In view of the conventionally experienced difficulties mentioned above, according to the present invention, a power supply device includes a control IC fabricated by a bipolar process and a power supply element fabricated by a MOS process, and has the control IC and the power supply element molded into a single package, with an edge of the chip of the control IC kept in intimate contact with an edge of the chip of the power supply element.

With this structure, a chip edge of the control IC fabricated by a bipolar process and a chip edge of the power supply element fabricated by a MOS process are kept in intimate contact with each other. This permits the heat generated by the power supply element to conduct with increased efficiency to the control IC.

The power supply element fabricated by a MOS process can have a horizontal structure so that a current flows from one part of the top surface of the chip to another. Thus, the control IC and the power supply element can be connected, at the bottom faces of their chips, to a common GND potential. This permits the control IC fabricated by a bipolar process and the power supply element fabricated by a MOS process to be together die-bonded on a leadframe with die-bonding paste.

Preferably, the chip edge of the control IC fabricated by a bipolar process and the chip edge of the power supply element fabricated by a MOS process are step-shaped, or are wedge-shaped, one convexly and another concavely. This helps increase the contact area between the chip edges and thereby achieve more contact therebetween.

The chip edge of the control IC fabricated by a bipolar process and the chip edge of the power supply element fabricated by a MOS process can be electrically connected together with conductive resin, or with Au wires. When Au wires are used, to prevent wire breakage, Au balls need to be first-wire-bonded again on second-wire-bonded Au wires.

By providing two or more of the power supply element fabricated by a MOS process, it is possible to readily design power supply devices that yield multiple outputs. In the power supply element fabricated by a MOS process, the Al pattern on the chip surface has insufficient hardness. Accordingly, it is necessary to use low-stress resin as the package material.

DETAILED DESCRIPTION OF THE INVENTION

Figure 1:
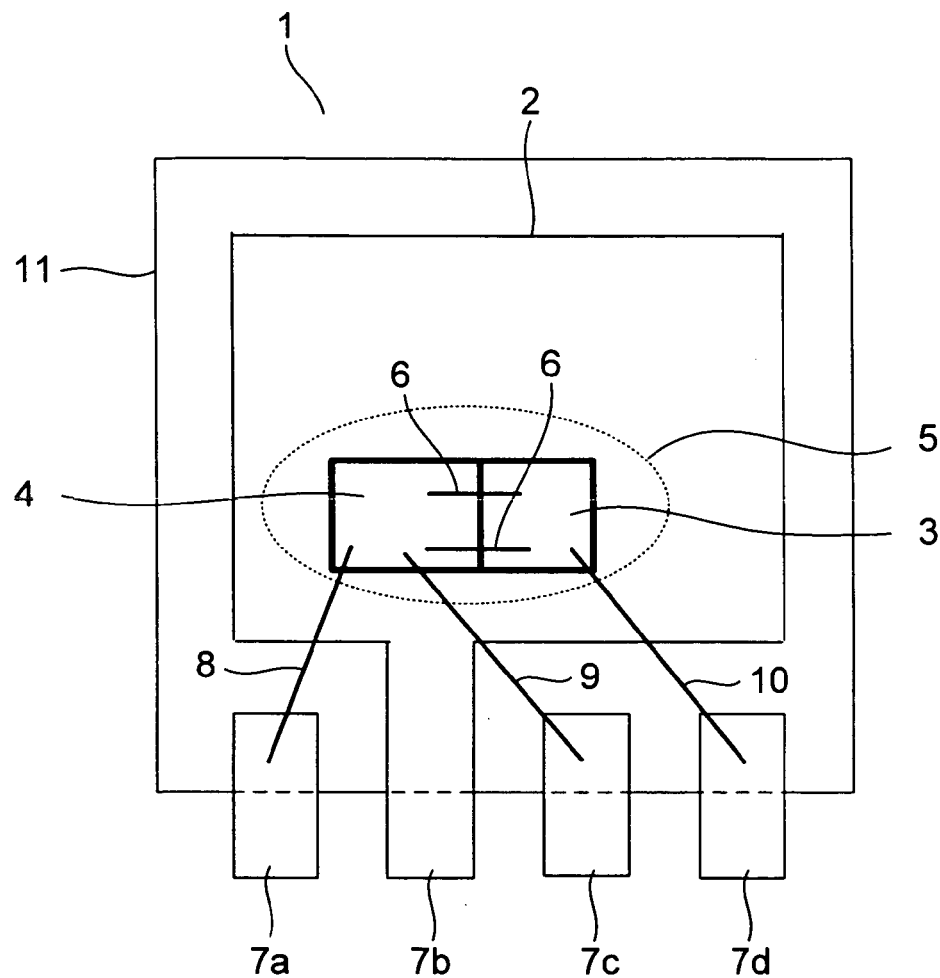
FIG. 1 is a sectional view showing an example of a power supply device (four-terminal series regulator) according to the invention.

Hereinafter, an embodiment of the present invention will be described with reference to the accompanying drawings. FIG. 1 is a sectional view showing a principal portion of a power supply device (four-terminal series regulator) according to the invention. As shown in FIG. 1, the power supply device 1 includes a control IC 3 fabricated by a bipolar process and a power supply element 4 fabricated by a MOS process, and have them molded into a single resin package 11, with a chip edge 3a (see FIG. 2) of the control IC 3 kept in intimate contact with a chip edge 4a (see FIG. 2) of the power supply element 4. In the following description, the structure of this power supply device 1 will be described in detail.

The power supply device 1 generates heat when operated as a regulator, and much of the heat is generated by the power supply element 4. Overheating of the power supply element 4 may break down the power MOS FET formed in the chip thereof On detecting an abnormal temperature in the power supply element 4, the control IC 3 activates an overheat protection circuit to shut off the gate voltage of the power MOS FET, and thereby serves to prevent overheating of the power supply element 4. Here, the overheat protection operation is achieved by detecting the heat that conducts from the power supply element 4 to the control IC 3, and therefore it is essential to design in such a way as to increase the heat conduction between them so that overheat protection operation is started without delay.

Figure 2:
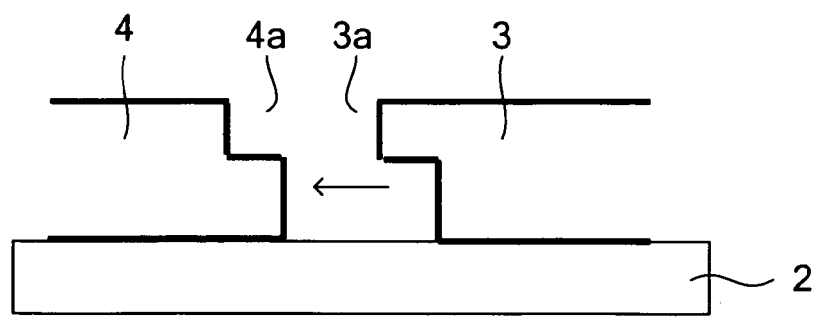
FIG. 2 is a sectional view showing an example of the shapes of chip edges of the power supply element fabricated by a MOS process and the control IC fabricated by a bipolar process which are die-bonded on the leadframe.
Figure 3:
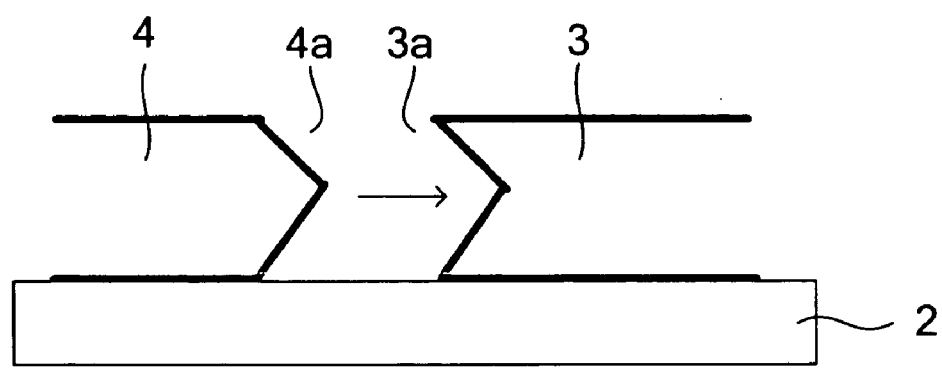
FIG. 3 is a sectional view showing another example of the shapes of chip edges of the power supply element fabricated by a MOS process and the control IC fabricated by a bipolar process which are die-bonded on the leadframe.
Figure 4:
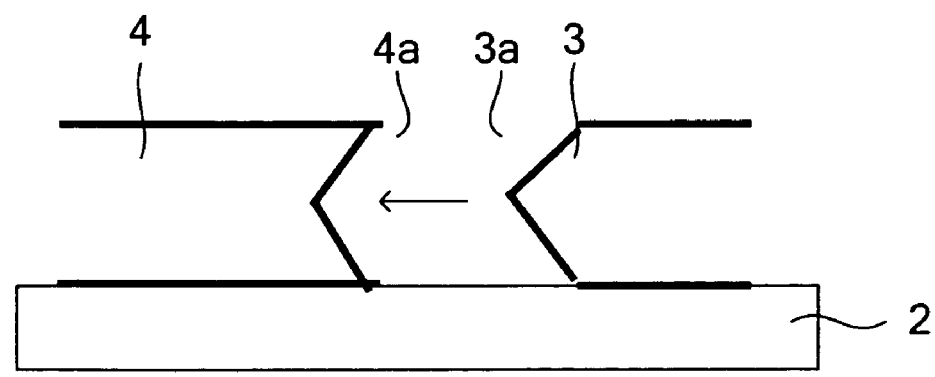
FIG. 4 is a sectional view showing still another example of the shapes of chip edges of the power supply element fabricated by a MOS process and the control IC fabricated by a bipolar process which are die-bonded on the leadframe.

Accordingly, as shown in FIG. 2, the chip edge 3a of the control IC 3 and the chip edge 4a of the power supply element 4 are so formed as to be step-shaped, and the control IC 3 and the power supply element 4 are die-bonded on a leadframe 2 with the chip edges 3a and 4a kept in contact with each other by being engaged with each other. This increases the contact area between them and achieves more contact between them. As a result, heat conducts via those chip edges 3a and 4a with increased efficiency, permitting the heat generated in the power supply element 4 to conduct quickly to the control IC 3. In this way, it is possible to prevent heat-induced breakdown to which a MOS semiconductor is susceptible. To achieve the same effects, the chip edges 3a and 4a may be so formed as to be wedge-shaped, one convexly and the other concavely, as shown in FIG. 3 or 4.

Here, attention should be paid to the following point. When the control IC 3 has detected an abnormal temperature in the power supply element 4, if the gate voltage of the power MOS FET is instantly shut off, a large current flows through the drain immediately after shutting-off, possibly resulting in breakdown of the power MOS FET. To avoid this, the control IC 3 is provided with a function of gradually shutting off the gate voltage so as to suppress the increase in the drain current. It is appropriate to allow several µs to several tens of µs for the gate voltage to trail off.

Figure 10:
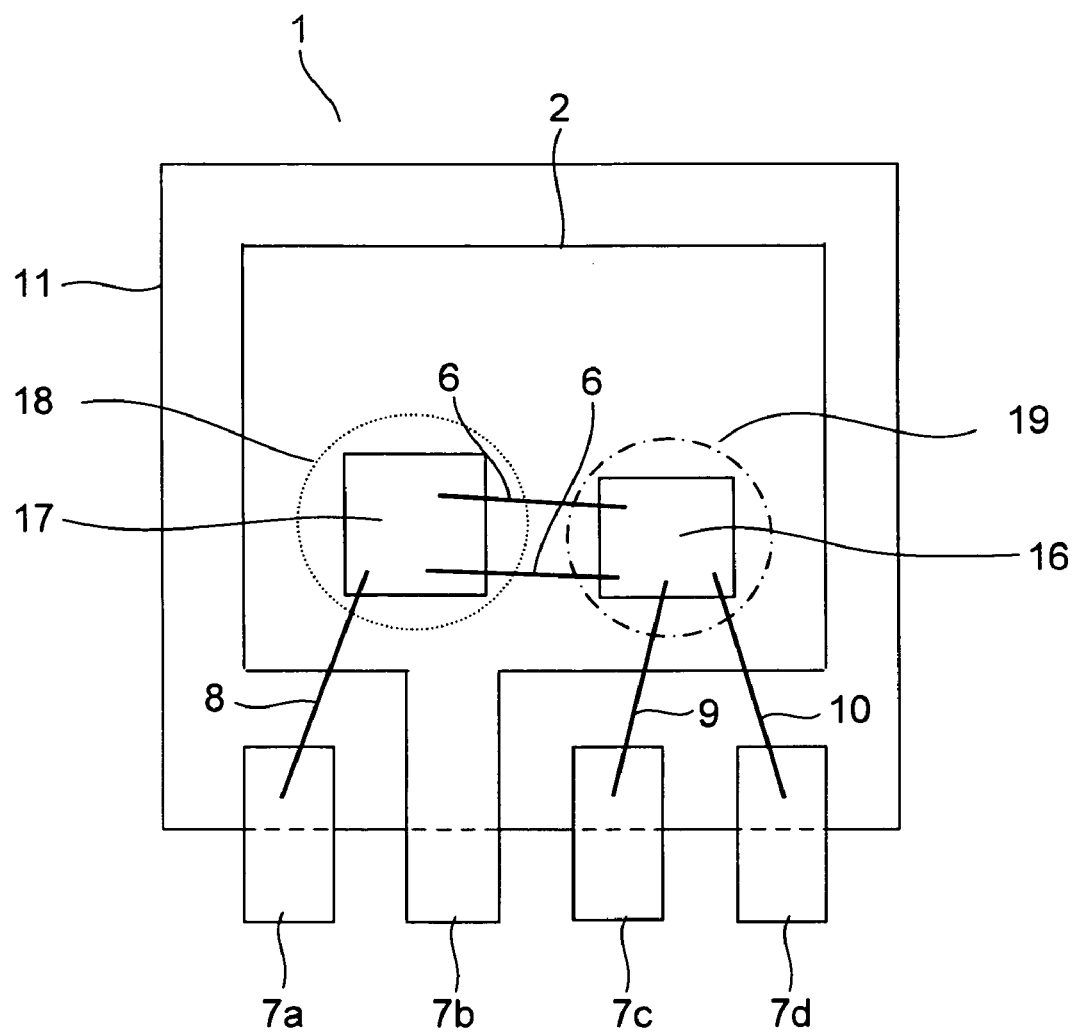
FIG. 10 is a sectional view showing another example of a conventional power supply device (four-terminal series regulator)
Figure 11:
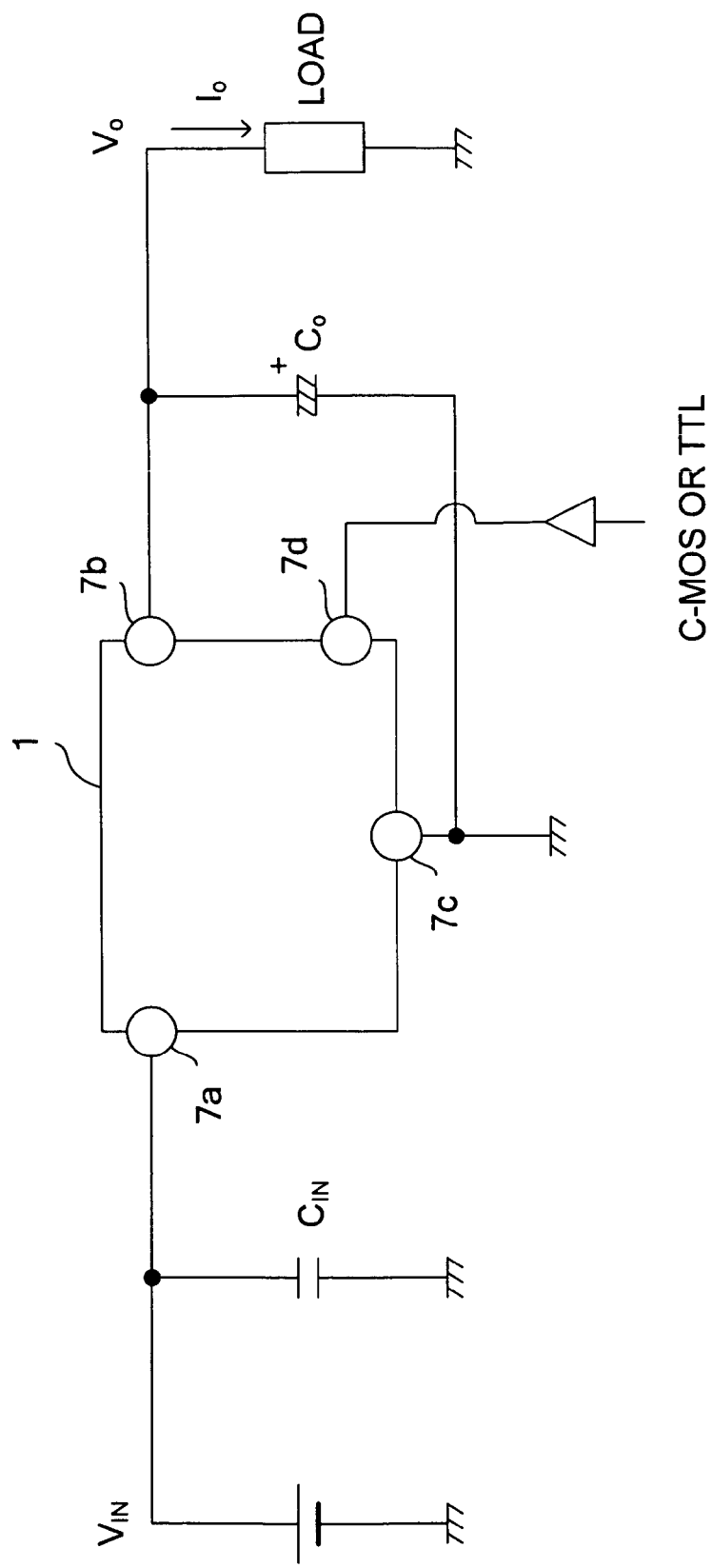
FIG. 11 shows an example of how a conventional power supply device is externally connected when used as a regulator.

In the conventional example shown in FIG. 10, to achieve low power loss, the power supply element 17 is realized with a PNP transistor having a vertical structure and fabricated by a bipolar process. This helps obtain a structure in which a current flows from one part of the chip surface to another. Accordingly, the bottom surface of the chip of the power supply element 17 is die-bonded to the leadframe 2 with conductive, high-melting-point solder 18. With this structure, as shown in FIG. 11, an output is obtained from a second terminal 7b. However, with respect to the control IC 16, although it is die-bonded on the same leadframe 2, the bottom surface of the chip of the control IC 16 needs to be insulated from the leadframe 2 to prevent electrostatic breakdown. Thus, the control IC 16 is die-bonded on the leadframe 2 with non-conductive epoxy paste 19.

By contrast, in the case of the power supply element 4 fabricated by a MOS process, a current flows from the drain to the source of the power MOS FET, and the power loss here depends on the drain-source resistance (on-state resistance) observed when a current flows therethrough. Accordingly, here, it is not necessary to adopt a vertical structure as adopted by the bipolar PNP transistor used in the conventional example, and it is possible to adopt instead a horizontal structure, in which a current flows from one part of the chip surface to another, and thereby easily achieve low power loss. As a result, the bottom surfaces of the chips of the power supply element 4 and the control IC 3 can both be connected to a common GND potential. Thus, as shown in FIG. 1, the power supply element 4 and the control IC 3 can together be die-bonded on the leadframe 2 with a single type of die-bonding paste as exemplified by Ag paste 5. In this way, it is possible to prevent electrostatic breakdown to which a bipolar semiconductor is susceptible.

Figure 5:
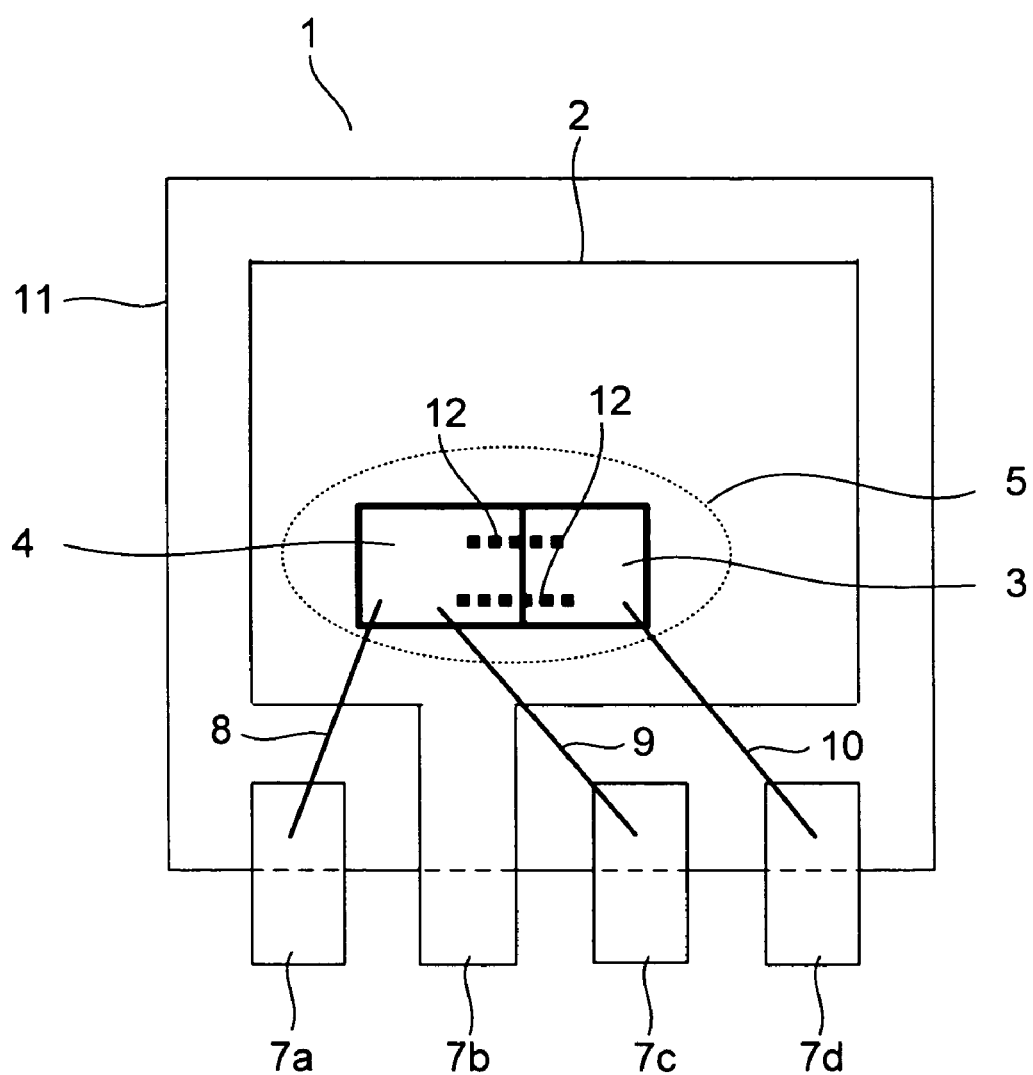
FIG. 5 is a sectional view showing another example of a power supply device (four-terminal series regulator) according to the invention.

The control IC 3 and the power supply element 4 die-bonded on the leadframe 2 as described above are then electrically connected together. This can be achieved by using Au wires 6 as shown in FIG. 1, or by using conductive resin 12 as shown in FIG. 5. Generally, conductive resin 12 is preferred because using Au wires is liable to result in wire breakage ascribable to an intermetallic compound produced at a junction between an Au wire and an Al pattern formed as a conductor pattern on a chip surface.

Figure 6A:
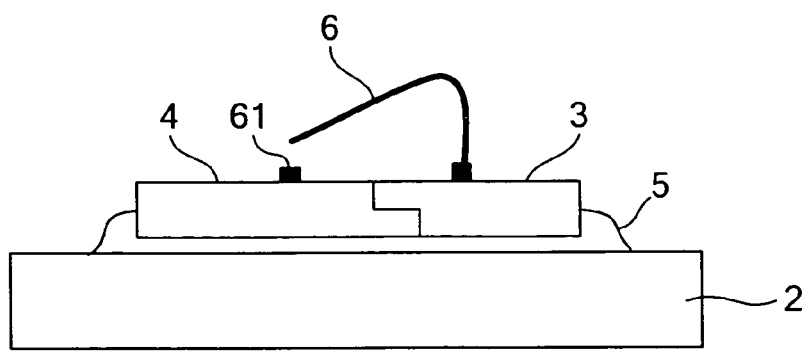
FIG. 6A is a sectional view showing, as one step in the procedure for electrically connecting together, by using Au wires, the power supply element fabricated by a MOS process and the control IC fabricated by a bipolar process, the state before an Au wire is second-bonded on a first-bonded Au ball.
Figure 6B:
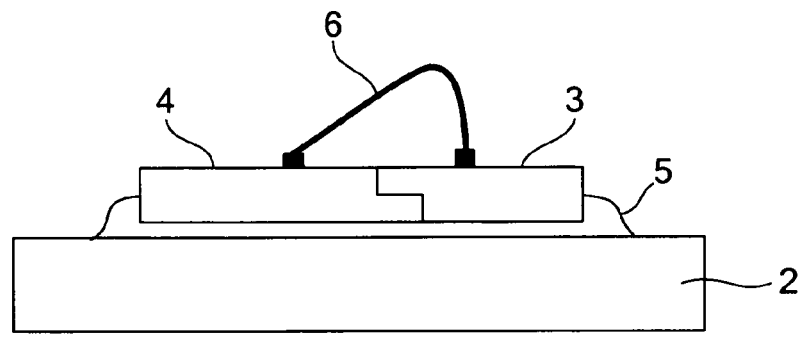
FIG. 6B is a sectional view showing, as one step in the procedure for electrically connecting together, by using Au wires, the power supply element fabricated by a MOS process and the control IC fabricated by a bipolar process, the state after an Au wire is second-bonded on a first-bonded Au ball.
Figure 6C:
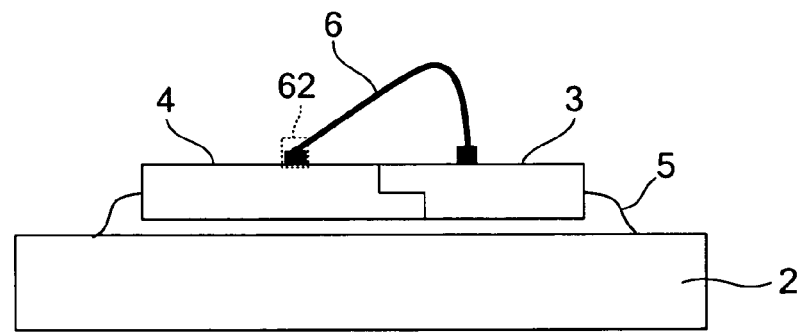
FIG. 6C is a sectional view showing, as one step in the procedure for electrically connecting together, by using Au wires, the power supply element fabricated by a MOS process and the control IC fabricated by a bipolar process, the state before an Au ball is first-bonded again on a second-bonded Au wire.
Figure 6D:
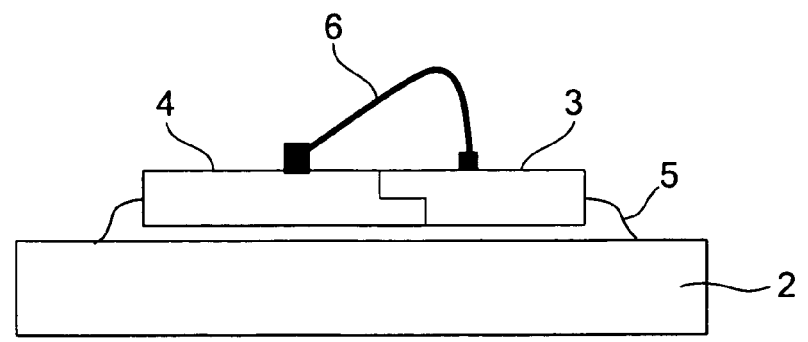
FIG. 6D is a sectional view showing, as one step in the procedure for electrically connecting together, by using Au wires, the power supply element fabricated by a MOS process and the control IC fabricated by a bipolar process, the state after an Au ball is first-bonded again on a second-bonded Au wire.

In a case where Au wires 6 are used, as shown in FIGS. 6A to 6D, on top of first-bonded Au balls 61, Au wires 6 are second-bonded (see FIGS. 6A and 6B), and then, on top of these second-bonded Au wires 6, Au balls 62 are first-bonded again (see FIGS. 6C and 6D). This helps reinforce the junctions.

In FIG. 1, reference numerals 7a, 7c, and 7d represent a first, a third, and a fourth terminal, respectively, that are each provided separately from the leadframe 2, and reference numeral 7b represents a second terminal that is formed so as to be continuous with the leadframe 2. The chip surface of the power supply element 4 is electrically connected to the first and third terminals 7a and 7c by Au wires 8 and 9, and the chip surface of the control IC 3 is electrically connected to the fourth terminal 7d by an Au wire 10.

All the above-described components provided on the leadframe 2 are, except the tip portions of the first to fourth terminals 7a to 7d, sealed in resin and thereby molded into a single resin package 11. In this way, the power supply device 1 as an end product is obtained. Here, to alleviate the influence of the package material on the chip surfaces, it is necessary to use, as the package material, low-stress resin. The reason is that, if the power supply element 4 fabricated by a MOS process is sealed in commonly used resin, the Al pattern formed on the chip surface thereof is prone to deformation because it has lower hardness than its counterpart in a PNP transistor fabricated by a bipolar process as conventionally used.

Figure 8:
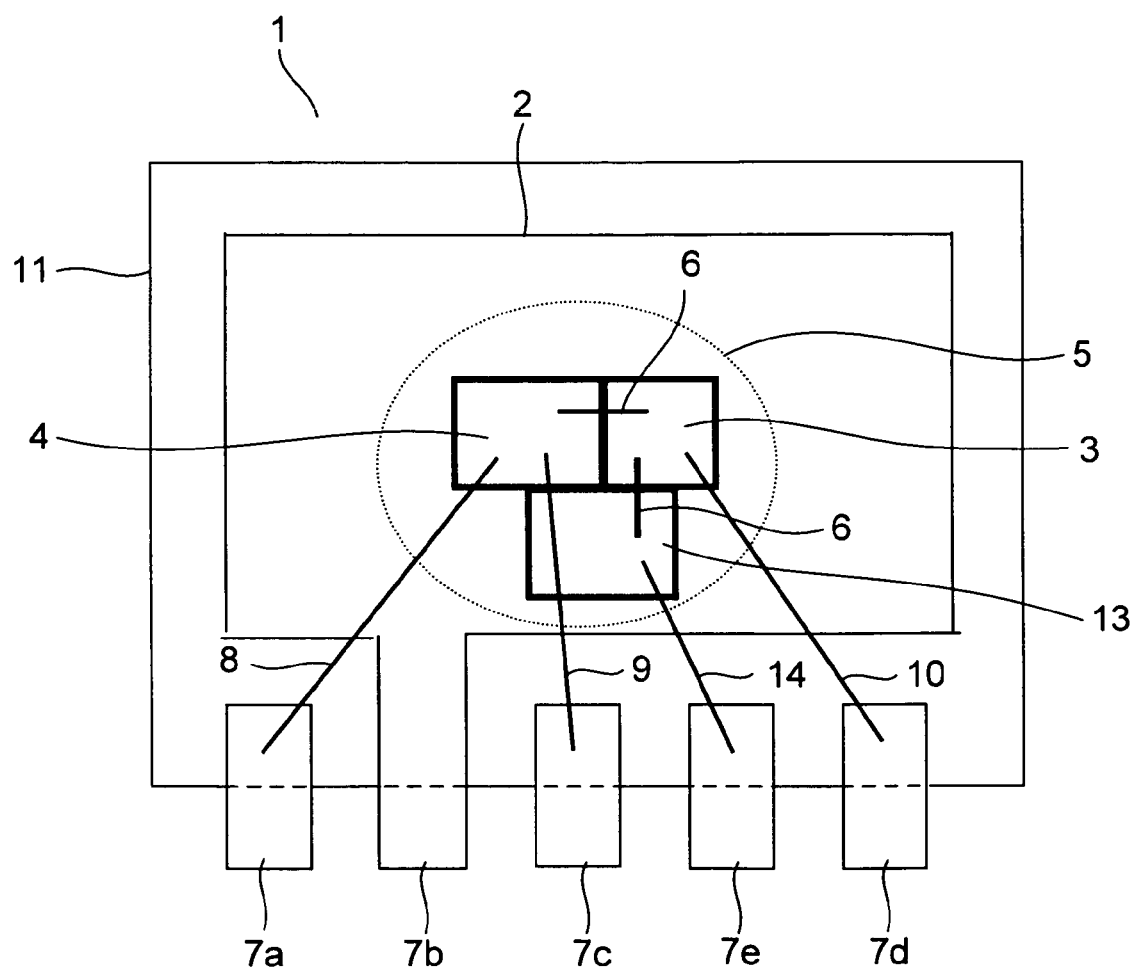
FIG. 8 is a sectional view showing an example of a power supply device (five-terminal series regulator) according to the invention.
Figure 9:
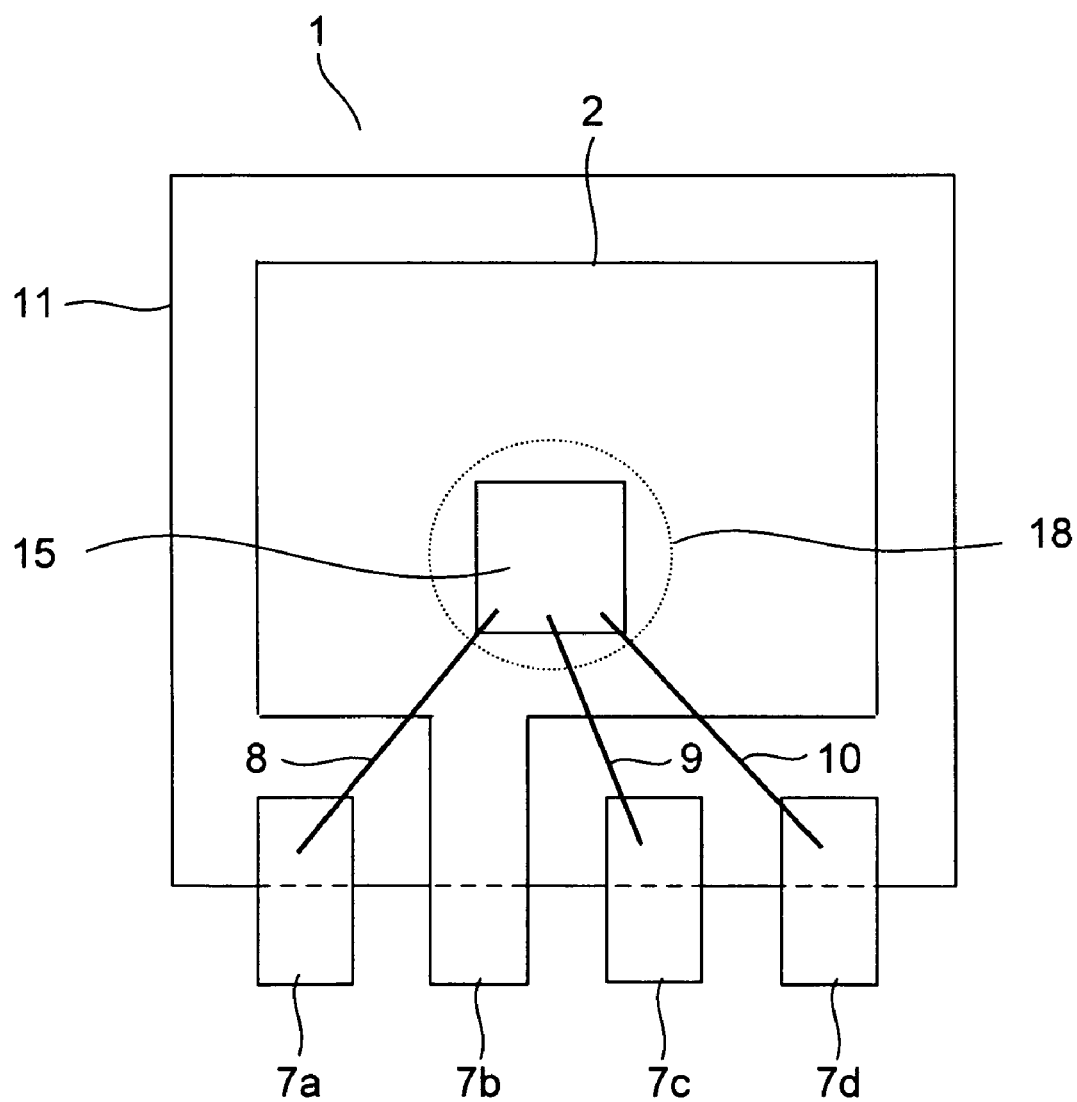
FIG. 9 is a sectional view showing an example of a conventional power supply device (four-terminal series regulator)

As shown in FIG. 8, three chips in total may together be die-bonded on a leadframe 2 with Ag paste 5. Here, of the three chips, two are chips of power supply elements (power supply elements 4 and 13) fabricated by a MOS process and one is a chip of a control IC 3. By using Au wires 6 or the like, the power supply element 4 and the control IC 3 are electrically connected together, and the power supply element 13 and the control IC 3 are electrically connected together. Moreover, by using Au wires 8, 9, 10, and 14, the surfaces of those chips are connected to a first, a third, a fourth, and a fifth terminals 7a, 7c, 7d and 7e. Then, all these components are molded into a single resin package 11. In this way, it is possible to easily realize a power supply device 1 (five-terminal series regulator) incorporating a single chip of a control IC 3 but having two output terminals (the third and fifth terminals 7c and 7e). In similar manners, by increasing the number of power supply elements fabricated by a MOS process, it is possible to design power supply devices that yield multiple outputs.

Figure 7:
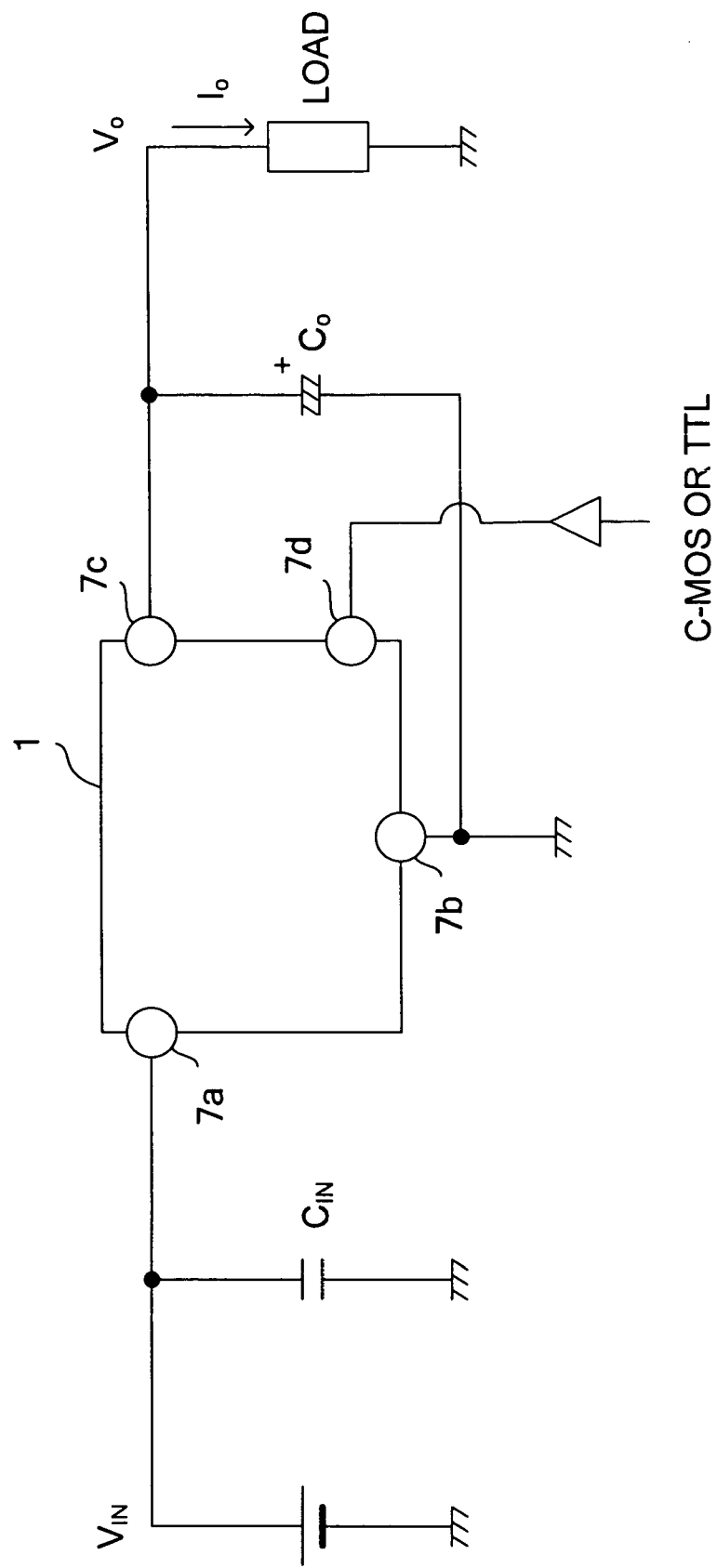
FIG. 7 shows an example of how a power supply device according to the invention is externally connected when used as a regulator.

FIG. 7 is a circuit diagram showing an example of how the power supply device 1 described above (the four-terminal series regulator) is externally connected when used as a regulator. The first terminal 7a serves as a DC input terminal, and is connected to a direct-current power source and a stabilizing input capacitor $C_{IN}$ that are connected in parallel. The second terminal 7b is grounded. The third terminal 7c serves as a DC output terminal, and is connected to a load such as an electronic appliance. Between the second and third terminals 7b and 7c, there is connected a stabilizing output capacitor $C_O$. The fourth terminal 7d serves as an output on/off control input terminal, and is connected to a TTL or C-MOS standard logic circuit or the like.

The internal power loss of the power supply device 1 is determined by calculating the difference between the input voltage $V_{IN}$ and the output voltage $V_O$ and then multiplying the result by the output current $I_O$. Accordingly, to design the power supply device 1 to offer low power loss, it is necessary to reduce the difference between the input and output voltages. The difference between the input and output voltages depends on the drain-source on-state resistance of the power MOS FET formed in the chip of the power supply element 4.

In general, whereas PNP transistors have emitter-collector saturation voltages in the range from about 0.3 V to about 5 V, power MOS FETs have drain-source on-state resistances of about 0.1Ω, although these vary with the drain current. Accordingly, when the output current $I_O$ is 1 A, whereas a conventional power supply device that employs as a power supply element a PNP transistor fabricated by a bipolar process offers an internal power loss in the range from about 0.3 W to about 0.5 W, the power supply device 1 of the invention offers an internal power loss of about 0.1 W.

As described above, the power supply device 1 of the invention permits the difference between the input and output voltages to be set smaller than when a PNP transistor fabricated by a bipolar process is used as conventionally practiced. Thus, the power supply device 1 of the invention helps achieve lower power loss than can conventionally be achieved.

Moreover, in the power supply device 1 of the invention, the high response that results as one benefit of using a MOS semiconductor offers the following advantages. First, high-speed variations in the output current $I_O$ can be coped with with excellent transient response. Second, when the power supply device 1 is used as a regulator, the output capacitor $C_O$ and the input capacitor $C_{IN}$ that are connected for stabilizing purposes can be given lower capacitances than are required conventionally. As these capacitors are given higher capacitances, their costs become higher, which adversely affects the costs of the regulator as a whole. Accordingly, the lower the capacitances of the capacitors, the less expensive it is to design power supplies.

Whereas a bipolar semiconductor has a temperature response such that, the higher the temperature, the higher the current amplification factor (hFE) thereof, a MOS semiconductor has a temperature response such that, the higher the temperature, the higher the on-state resistance thereof, making it more difficult for the drain current to flow. Specifically, in a conventional two-chip power supply device 1, like the one shown in FIG. 10, that uses a control IC 16 and a power supply element 17 that are both fabricated by a bipolar process, as temperature rises, the hFEs of both chips increase. By contrast, in the power supply device 1 of the invention, the power supply element 4 and the control IC 3 respond oppositely against variation in temperature.

As described above, according to the present invention, a power supply device includes a control IC fabricated by a bipolar process and a power supply element fabricated by a MOS process, and has them die-bonded on a leadframe with a chip edge of one of them kept in intimate contact with a chip edge of the other. Thus, heat conducts via those chip edges with increased efficiency, permitting the heat generated in the power supply element to conduct quickly to the control IC. This helps prevent heat-induced breakdown to which a MOS semiconductor is susceptible.

Moreover, the power supply element fabricated by a MOS process does not need to have a vertical structure as a PNP transistor, i.e., a bipolar semiconductor, does, and thus helps easily realize lower power loss by adopting a horizontal structure, in which a current flows from one part of the chip surface to another. As a result, the rear surfaces of the chips of the power supply element and the control IC can both be connected to a common GND potential, and thus the power supply element and the control IC can together be die-bonded on the leadframe with a single type of die-bonding paste as exemplified by Ag paste. This helps prevent electrostatic breakdown to which a bipolar semiconductor is susceptible.

What is claimed is:

1. A power supply device comprising a control IC fabricated by a bipolar process and a power supply element fabricated by a MOS process, wherein the control IC and the power supply element are molded into a single package, with an edge of a chip of the control IC kept in intimate contact with an edge of a chip of the power supply element.

2. The power supply device of claim 1, wherein the control IC fabricated by a bipolar process and the power supply element fabricated by a MOS process are together die-bonded on a leadframe with die-bonding paste.

3. The power supply device of claim 1, wherein the edge of the chip of the control IC fabricated by a bipolar process and the edge of the chip of the power supply element fabricated by a MOS process are step-shaped.

4. The power supply device of claim 1, wherein the edge of the chip of the control IC fabricated by a bipolar process and the edge of the chip of the power supply element fabricated by a MOS process are wedge-shaped, one convexly and another concavely.

5. The power supply device of claim 1, wherein the control IC fabricated by a bipolar process and the power supply element fabricated by a MOS process are electrically connected together with conductive resin.

6. The power supply device of claim 1, wherein the control IC fabricated by a bipolar process and the power supply element fabricated by a MOS process are electrically connected together with Au wires.

7. The power supply device of claim 6, wherein, on second-wire-bonded Au wires, Au balls are first-wire-bonded again.

8. The power supply device of claim 1, wherein there are provided two or more of the power supply element fabricated by a MOS process.

9. The power supply device of claim 1, wherein the package is made of low-stress resin.

10. The power supply device of claim 1, wherein the contact between the edge of the control IC chip and the edge of the power supply element chip is sufficient for the control IC to detect heat conducted from the power supply element to the control IC.

11. A power supply device comprising a bipolar control IC element and a MOS power supply element, wherein the bipolar control IC element and the MOS power supply element are molded into a single package, with a surface of an edge of the bipolar control IC element in contact with a surface of an edge of the MOS power supply element.

12. The power supply device of claim 11, wherein each of the bipolar control IC element and the MOS power supply element are die-bonded to a leadframe by a die-bonding paste.

13. The power supply device of claim 11, wherein the edge of the bipolar control IC element and the edge of the MOS power supply element are step-shaped.

14. The power supply device of claim 11, wherein the edge of the bipolar control IC element and the edge of the MOS power supply element are wedge-shaped, one convexly and another concavely.

15. The power supply device of claim 11, wherein the bipolar control IC element and the MOS power supply element are electrically connected together with conductive resin.

16. The power supply device of claim 11, wherein the bipolar control IC element and the MOS power supply element are electrically connected together with Au wires.

17. The power supply device of claim 11, wherein there are provided two or more of the MOS power supply element.

18. The power supply device of claim 11, wherein the package is made of low-stress resin.

19. The power supply device of claim 11, wherein the bipolar control IC element detects heat conducted from the MOS power supply element to the bipolar control IC element.

20. The power supply device of claim 19, wherein upon the bipolar control IC element detecting conducted heat above a predetermined temperature, the bipolar control IC element activates an overheat protection circuit to gradually shut off the gate voltage of the MOS power supply element within a predetermined period of time.

* * * * *